United States Patent [19]

Nunoue et al.

[11] Patent Number: 5,905,275
[45] Date of Patent: May 18, 1999

[54] GALLIUM NITRIDE COMPOUND SEMICONDUCTOR LIGHT-EMITTING DEVICE

[75] Inventors: Shinya Nunoue, Ichikawa; Masahiro Yamamoto, Sagamihara, both of Japan

[73] Assignee: Kabushiki Kaisha Toshiba, Kawasaki, Japan

[21] Appl. No.: 08/876,739

[22] Filed: Jun. 16, 1997

[30] Foreign Application Priority Data

Jun. 17, 1996 [JP] Japan ................................. 8-155650

[51] Int. Cl.⁶ ............................ H01L 33/00; H01L 23/13
[52] U.S. Cl. ............................. 257/95; 257/99; 257/76; 257/98; 257/103; 372/45
[58] Field of Search .............................. 257/76, 94–99, 257/103; 372/44–45, 50

[56] References Cited

U.S. PATENT DOCUMENTS

| 4,396,929 | 8/1983 | Ohki et al. | 257/76 |
| 4,408,217 | 10/1983 | Kobayashi et al. | 257/76 |
| 4,608,581 | 8/1986 | Bagratishvili et al. | 257/76 |

FOREIGN PATENT DOCUMENTS

| 7-202325 | 8/1995 | Japan . |
| 7-221347 | 8/1995 | Japan . |

*Primary Examiner*—John Guay
*Attorney, Agent, or Firm*—Oblon, Spivak, McClelland, Maier & Neustadt, P.C.

[57] ABSTRACT

A gallium nitride compound semiconductor light-emitting device uses a sapphire substrate as a support and has n- and p-type electrodes on the top and bottom surfaces. A trench is formed in the sapphire substrate. This trench has two side wall surfaces which extend from the top surface to the bottom surface and so incline as to converge downward. A buffer layer is formed on the sapphire substrate. A gallium nitride compound semiconductor multiple layer having an n-type layer and a p-type layer are formed on the buffer layer. This semiconductor multiple layer has two side portions arranged along the two side wall surfaces of the trench and a central portion positioned between these two side portions and formed integrally with the two side portions. N- and p-type electrodes are so formed as to oppose each other on the two sides of the central portion of the semiconductor multiple layer.

12 Claims, 6 Drawing Sheets

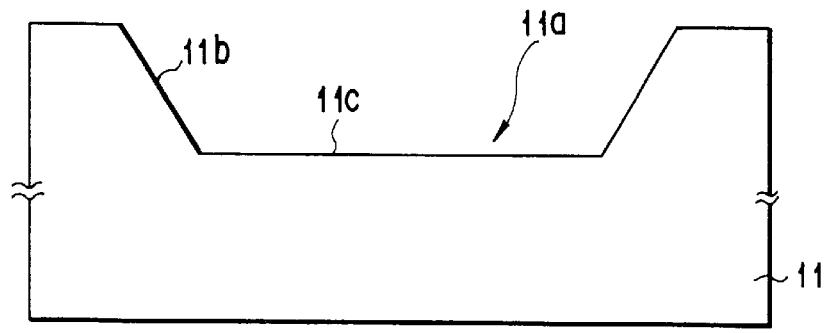
F I G. 1A
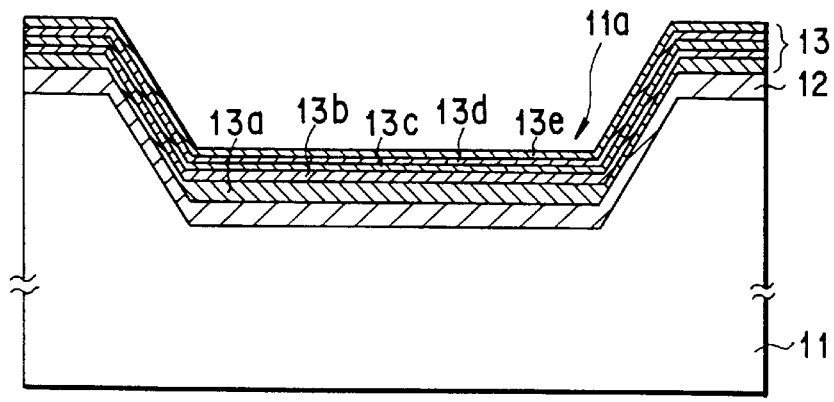
F I G. 1B
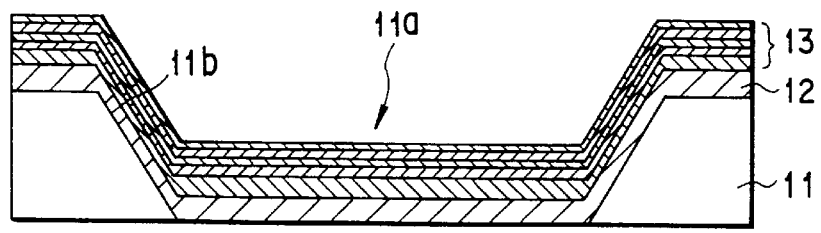
F I G. 1C
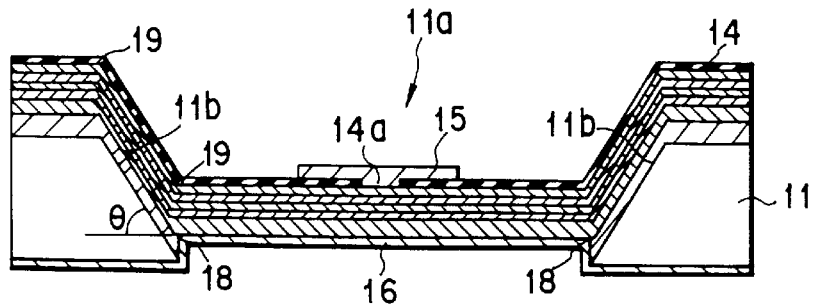
F I G. 1D

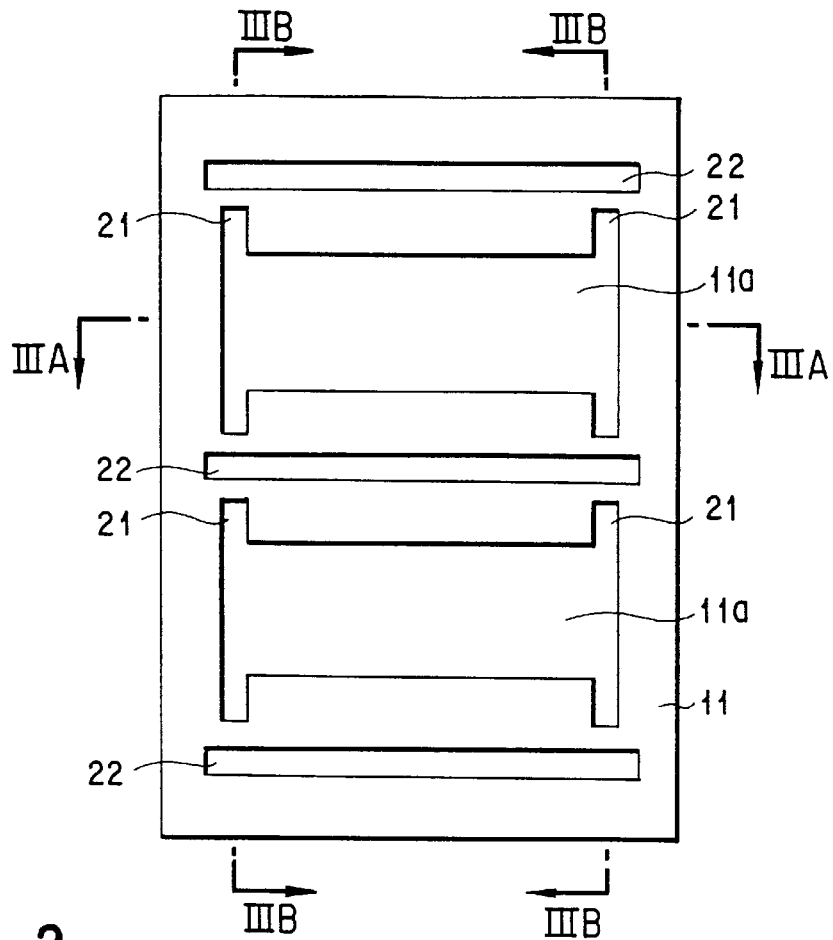
F I G. 2
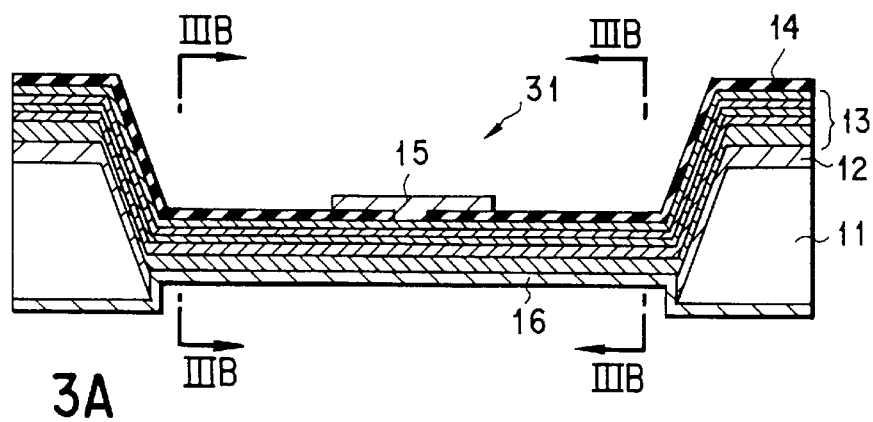
F I G. 3A
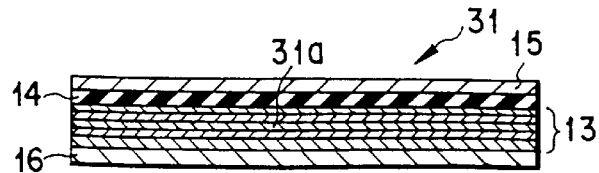
F I G. 3B

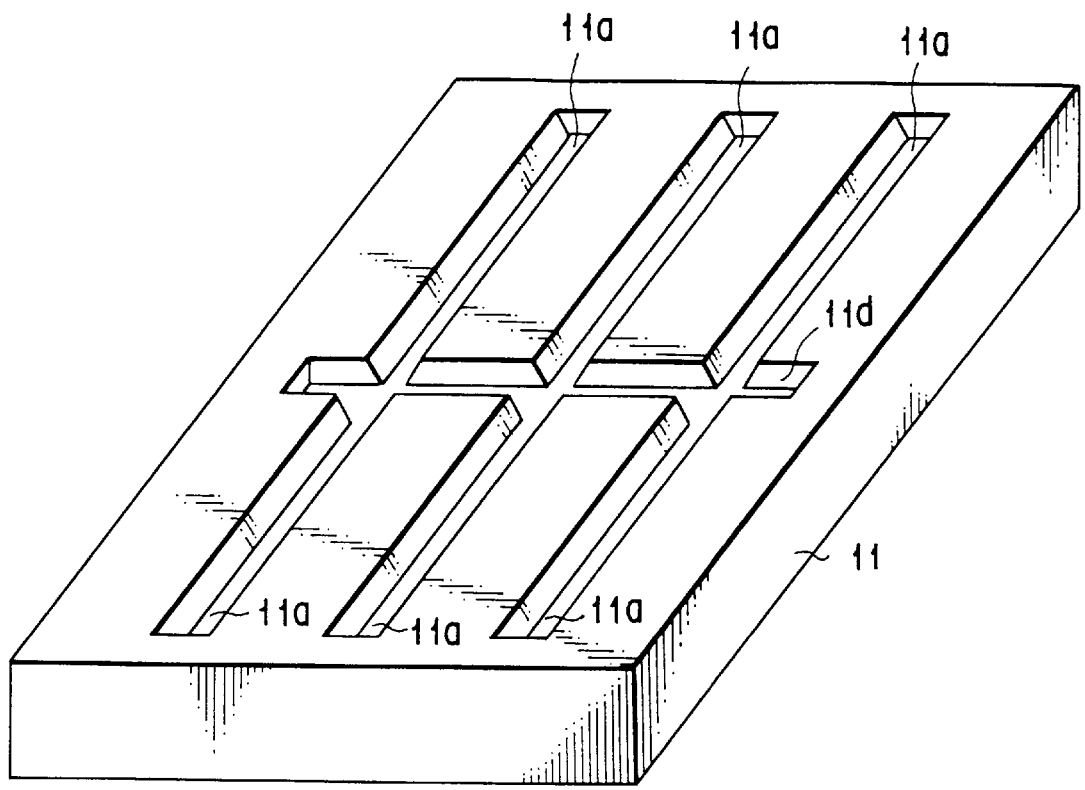
F I G. 4
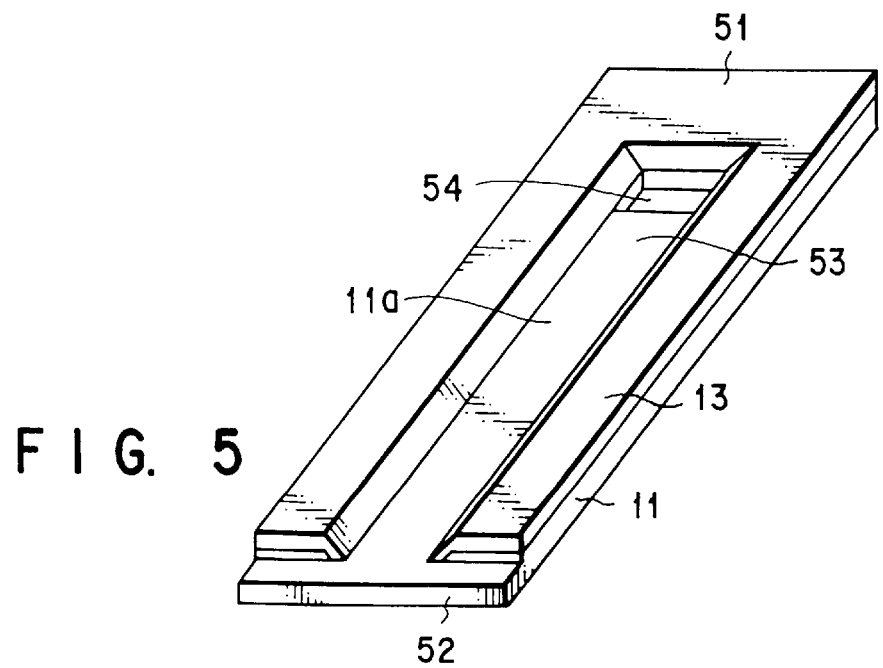
F I G. 5

GALLIUM NITRIDE COMPOUND SEMICONDUCTOR LIGHT-EMITTING DEVICE

BACKGROUND OF THE INVENTION

The present invention relates to a gallium nitride compound semiconductor light-emitting device using a sapphire substrate as a support and having n- and p-type electrodes on both the top and bottom surfaces.

As light-emitting devices such as semiconductor lasers or LEDs, gallium nitride compound semiconductor light-emitting devices using a sapphire substrate are used. In light-emitting devices of this sort, since a sapphire substrate is insulating and it is difficult to form holes in the substrate, n- and p-type electrodes are formed on the same surface. Consequently, the chip size is increased, and this decreases the number of chips obtainable from one wafer and increases the cost. Also, since the electrode gap cannot be narrowed, the device resistance increases. Additionally, the light emission efficiency is decreased because uniform carrier injection becomes difficult to perform. Furthermore, if the electrode gap is narrowed, an electric short circuit may occur.

To solve these problems, Jpn. Pat. Appln. KOKAI Publication Nos. 7-202325 and 7-221347 have disclosed light-emitting devices in which n- and p-type electrodes are formed on both the top and bottom surfaces of a gallium nitride compound semiconductor multiple layer stacked on a sapphire substrate. In the fabrication of the light-emitting devices disclosed in these references, a gallium nitride compound semiconductor multiple layer having n- and p-type layers is stacked on a sapphire substrate. Subsequently, a portion of the sapphire substrate is removed from the bottom surface to expose the bottom surface of the semiconductor multiple layer. Thereafter, n- and p-type electrodes are formed on the top and bottom surfaces of the semiconductor multiple layer.

That is, in the light-emitting device fabrication methods disclosed in the above patent publications, a gallium nitride compound semiconductor multiple layer is stacked on a sapphire substrate, and then holes for forming electrodes are formed in the sapphire substrate. These holes are formed by means of a physical processing technique using, e.g., a dicer, or an etching technique such as dry etching or wet etching. However, these techniques have the following problems.

When the physical processing technique such as a dicer is used, it is essentially impossible to cut only the sapphire substrate with a high controllability without giving any damages to the stacked gallium nitride semiconductor layers.

When sapphire is to be processed by dry etching, it is necessary to use ion energy larger than ion energy when a gallium nitride semiconductor is etched. This increases the contribution of physical sputtering and decreases the etching selectivity between the sapphire and the gallium nitride semiconductor. As a result, it becomes difficult to stop etching with a high controllability at the interface between the sapphire substrate and the gallium nitride semiconductor layers. This gives etching damages to the gallium nitride semiconductor layers.

Also, the etching rate of sapphire is very low in dry etching or wet etching. For this reason, it is practically difficult to form holes in a sapphire substrate usually having a thickness of 350 $\mu$m or more without damaging gallium nitride semiconductor layers.

As described above, the conventional techniques give damages to gallium nitride semiconductor layers when processing a sapphire substrate. This leads to serious problems of a decrease in the yield of devices and degradation of the device characteristics.

BRIEF SUMMARY OF THE INVENTION

It is therefore an object of the present invention to prevent a decrease in the yield of devices and degradation of the device characteristics resulting from damages to semiconductor layers in a gallium nitride compound semiconductor light-emitting device using a sapphire substrate as a support and having n- and p-type electrodes on both the top and bottom surfaces.

According to a first aspect of the present invention, there is provided a gallium nitride compound semiconductor light-emitting device comprising:

a sapphire substrate having a trench with two side wall surfaces which extend from a top surface to a bottom surface and inclined so as to converge downward;

a gallium nitride compound semiconductor multiple layer supported by the sapphire substrate and having an n-type layer and a p-type layer, the semiconductor multiple layer having two side portions arranged along the two side wall surfaces and a central portion positioned between the two side portions and formed integrally with the two side portions; and first and second electrodes connected to top and bottom surfaces, respectively, of the semiconductor multiple layer so that the first and second electrodes are positioned on top and bottom sides of the device.

According to a second aspect of the present invention, there is provided a gallium nitride compound semiconductor light-emitting device comprising:

a sapphire substrate in which a contact hole is formed;

a buried layer formed in the contact hole and consisting essentially of a material having a lattice constant close to a lattice constant of a gallium nitride compound semiconductor;

a gallium nitride compound semiconductor multiple layer formed on the sapphire substrate so as to cover the contact hole and having an n-type layer and a p-type layer; and first and second electrodes connected to top and bottom surfaces, respectively, of the semiconductor multiple layer so that the first and second electrodes are positioned on top and bottom sides of the device, the second electrode being connected to the semiconductor multiple layer through the contact hole.

According to a third aspect of the present invention, there is provided a method of fabricating a gallium nitride compound semiconductor light-emitting device, comprising the steps of:

forming a trench having two side wall surfaces which so incline as to converge inward in a first surface of a sapphire substrate;

forming a gallium nitride compound semiconductor multiple layer having an n-type layer and a p-type layer on the first surface of the sapphire substrate including the trench, the semiconductor multiple layer having two side portions arranged along the two side wall surfaces and a central portion positioned between the two side portions and formed integrally with the two side portions;

polishing the sapphire substrate from a second surface away from the first surface and thereby thinning the sapphire substrate until the trench extends through the sapphire substrate; and connecting first and second electrodes to top and bottom surfaces, respectively, of the semiconductor multiple layer so that the first and second electrodes are positioned on top and bottom sides of the device.

According to a fourth aspect of the present invention, there is provided a method of fabricating a gallium nitride compound semiconductor light-emitting device, comprising the steps of:

forming a contact hole in a sapphire substrate;

adhering a first layer to the sapphire substrate including the contact hole, the first layer consisting essentially of a first material having a lattice constant close to a lattice constant of a gallium nitride compound semiconductor;

forming a buried layer on the sapphire substrate including the contact hole, the buried layer consisting essentially of a second material which has a lattice constant close to a lattice constant of a gallium nitride compound semiconductor and can be selectively etched with respect to the first material;

removing the first layer from the sapphire substrate by selectively etching the first material with respect to the second material;

forming a gallium nitride compound semiconductor multiple layer having an n-type layer and a p-type layer on the buried layer and the sapphire substrate; and connecting first and second electrodes to top and bottom surfaces, respectively, of the semiconductor multiple layer so that the first and second electrodes are positioned on top and bottom sides of the device, the second electrode being connected to the semiconductor multiple layer through the contact hole.

According to a fifth aspect of the present invention, there is provided a method of fabricating a gallium nitride compound semiconductor light-emitting device, comprising the steps of:

forming a contact hole in a sapphire substrate;

forming a gallium nitride compound semiconductor multiple layer having an n-type layer and a p-type layer on the sapphire substrate including the contact hole; and connecting first and second electrodes to top and bottom surfaces, respectively, of the semiconductor multiple layer so that the first and second electrodes are positioned on top and bottom sides of the device, the second electrode being connected to the semiconductor multiple layer through the contact hole.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are sectional views showing a method of fabricating a gallium nitride compound semiconductor laser (light-emitting device) according to one embodiment of the present invention in order of steps;

FIG. 2 is a plan view showing a sapphire substrate when the step shown in FIG. 1 is completed;

FIG. 3A is a sectional view taken along the line IIIA—IIIA in FIG. 2 in a state in which a light-emitting device is formed, and FIG. 3B is a sectional view taken along the lines IIIB—IIIB in FIGS. 2 and 3A;

FIG. 4 is a perspective view showing a modification of the sapphire substrate when the step shown in FIG. 1A is completed;

FIG. 5 is a perspective view showing one device finished by using the sapphire substrate shown in FIG. 4;

DETAILED DESCRIPTION OF THE INVENTION

Figure 6A:
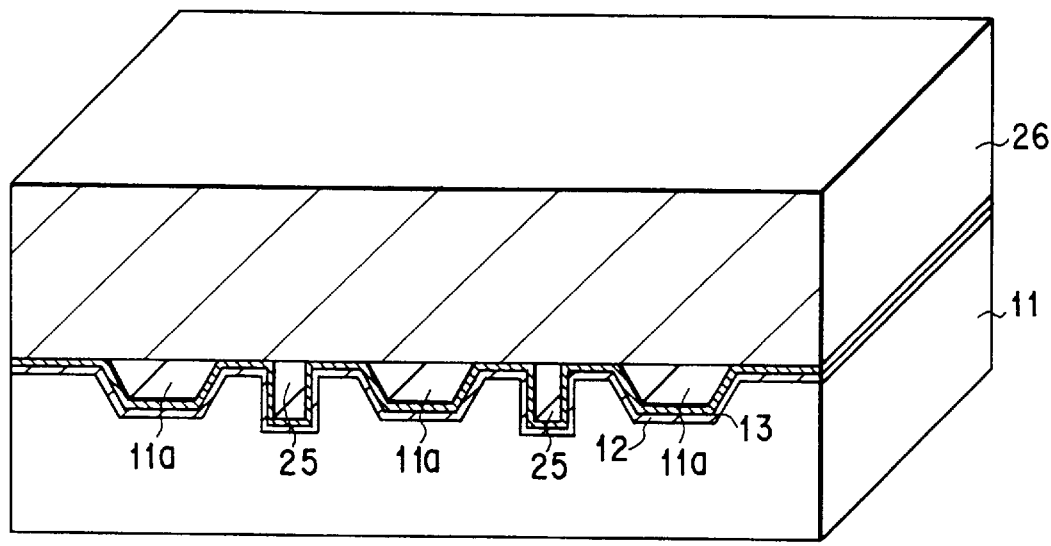
FIGS. 6A to 6C are perspective sectional views showing a method of fabricating a gallium nitride compound semiconductor laser (light-emitting device) according to another embodiment of the present invention in order of steps.

FIGS. 1A to 1D are sectional views showing a method of fabricating a gallium nitride compound semiconductor laser (light-emitting device) according to one embodiment of the present invention in order of steps.

As shown in FIG. 1A, a 40-$\mu$m deep trench 11a is formed in one surface of a 350-$\mu$m thick sapphire substrate 11. This trench can be formed by, e.g., the following method.

That is, amorphous carbon (a-C) is deposited to a thickness of 1 $\mu$m by sputtering, a photoresist is applied, and a photoresist pattern is formed by regular photolithography. This photoresist pattern is used as a mask to etch the a-C layer by reactive ion etching (RIE) using $CF_4$ gas, thereby transferring the pattern.

Subsequently, the a-C layer is used as a mask to etch sapphire by reactive ion beam etching (RIBE) using a $Cl_2/Ar$ gas mixture. Thereafter, the layer damaged by dry etching is removed by using a phosphoric acid etchant. After the trench 11a is formed, the a-C layer is removed by an $O_2$ asher. The trench 11a thus formed consists of tapered side wall surfaces 11b and a flat bottom surface 11c.

Note that the method of forming the trench 11a in the sapphire substrate 11 is not limited to dry etching. For example, it is possible to use a mechanical processing method such as a dicer, ultrasonic processing, or polishing, a physical processing method such as laser processing, or any other method.

Subsequently, as shown in FIG. 1B, a buffer layer 12 made of, e.g., AlN and a gallium nitride compound semiconductor multiple layer 13 are stacked in this order by MOCVD on the sapphire substrate 11 in which the trench 11a is formed. The buffer layer 12 can be formed by using a conductive or nonconductive material, e.g., ZnO, GaN, AlN, GaAlN, $LiAlO_2$, $LiGaO_2$, $MgAl_2O_4$, or SiC, having a lattice constant very close to that of a gallium nitride compound semiconductor. The gallium nitride compound semiconductor multiple layer 13 consists of an n-GaN contact layer 13a, an n-GaAlN cladding layer 13b, an InGaN active layer 13c, a p-GaAlN cladding layer 13d, and a p-GaN contact layer 13e in this order from the buffer layer 12. The gallium nitride compound semiconductor multiple layer 13 can also be formed by using another crystal growth method, such as MBE, instead of MOCVD.

As shown in FIG. 1C, the sapphire substrate 11 is polished, until the buffer layer 12 is exposed, from the surface away from the surface on which the gallium nitride compound semiconductor multiple layer 13 is stacked. If the sapphire substrate 11 is thick, a coarse polishing powder is used. As the thickness decreases, the grain diameter of a polishing power is decreased. Mechanochemical polishing is performed immediately before the buffer layer 12 is exposed. This reduces damages caused by polishing to the gallium nitride compound semiconductor multiple layer 13.

After RIBE is performed by using a $Cl_2$/Ar gas mixture, the buffer layer 12 is removed by wet etching using a phosphoric acid etchant by using the sapphire substrate 11 as a mask. In this RIBE, etching is performed under conditions with a smaller physical sputtering effect and a larger chemical effect than those of the etching conditions for the sapphire substrate 11, thereby reducing etching damages to the gallium nitride compound semiconductor multiple layer. If the buffer layer 12 is a conductive layer, the buffer layer 12 need not be entirely removed; i.e., it is only necessary to remove a portion of the buffer layer 12 in order to remove damages.

Subsequently, as shown in FIG. 1D, an $SiO_2$ oxide film 14 is formed as a protective film on the stacked gallium nitride compound semiconductor multiple layer 13, and a contact hole 14a is formed in a portion of the oxide film 14. Thereafter, a p-type electrode 15 is so formed as to bury the contact hole 14a and is connected to the top surface of the semiconductor multiple layer 13. Also, an n-type electrode 16 is formed on the bottom surface of the sapphire substrate 11 and connected to the bottom surface of the semiconductor multiple layer 13. In the bottom portion of the trench 11a where the buffer layer 12 is removed, the n-type electrode 16 is in contact with the n-GaN contact layer 13a of the exposed gallium nitride compound semiconductor multiple layer 13.

The gallium nitride compound semiconductor laser according to this embodiment fabricated by the above method has a structure in which the p-type electrode 15 and the n-type electrode 16 are formed on the top and bottom surfaces of the device and oppose each other with the semiconductor multiple layer 13 between them. This narrows the gap between the electrodes 15 and 16 and lowers the device resistance. Also, with this structure, it is possible to uniformly and efficiently inject carriers into the InGaN active layer 13c in the gallium nitride compound semiconductor multiple layer 13.

Furthermore, when the device is to be mounted on a heat sink, the gallium nitride compound semiconductor multiple layer 13 can be directly brought into contact with the heat sink without the sapphire substrate 11 between them. This minimizes the thermal influence on the device characteristics. The sapphire substrate 11 remaining around this light-emitting device protects the device and maintains the mechanical strength of the device. Also, the tapered side wall surfaces 11b of the trench 11a function as reflection surfaces which focus light emitted by the bottom surface of the trench 11a upward. Therefore, light is emitted from the top surface of the semiconductor multiple layer 13, and this makes the structure suitable for an LED device.

It should be noted that some of the above advantages are brought about because a central portion 18 (see FIG. ID) of the semiconductor multiple layer 13 which functions as an active portion of the light-emitting device is formed in the trench 11a of the sapphire substrate 11, desirably between the top and bottom surfaces of the sapphire substrate 11. This is made possible because the trench 11a has the two side wall surfaces 11b which so incline as to converge downward and two side portions 19 of the gallium nitride compound semiconductor multiple layer 13 are supported by these side wall surfaces 11b.

If an angle θ of the two side wall surfaces 11b with respect to the top or bottom surface (these top and bottom surfaces are generally parallel) of the central portion 18 of the semiconductor multiple layer 13 is too large, the mechanical strength of the connecting portions between the semiconductor multiple layer 13 and the two side portions of the central portion 18 decreases. This increases the possibility that these connecting portions crack. On the other hand, if the angle θ is too small, the central portion 18 of the semiconductor multiple layer 13 projects outward from the trench 11a. Consequently, the active portion of the light-emitting device is not protected any longer. Further, in this case, the width of a single device becomes large. Accordingly, the angle θ is desirably set at 30° to 90°

FIG. 2 is a plan view showing the sapphire substrate 11 when the step shown in FIG. 1A is completed. Two trenches 11a are formed in the sapphire substrate 11, and slits 21 are formed in the two end portions of each trench 11a in the widthwise direction (along the lines IIIB—IIIB). Additionally, slits 22 are formed along the two sides in the longitudinal direction of the trenches 11a. These slits 21 and 22 are so formed that two separate light-emitting devices are obtained when the sapphire substrate 11 is cleaved along the slits 21 and 22 as shown in FIG. 2 after the step shown in FIG. 1D is completed.

FIG. 3A is a sectional view taken along the line IIIA—IIIA in FIG. 2. FIG. 3B is a sectional view taken along the lines IIIB—IIIB in FIGS. 2 and 3A. As shown in FIG. 3B, the sapphire substrate 11 is removed along the lines IIIB—IIIB, i.e., the slits 21. Therefore, when the semiconductor multiple layer 13 is cleaved, two end faces 31a of a light-emitting device 31 function as end-face mirrors of a laser resonator. Accordingly, end-face mirrors of a laser resonator can be easily formed by the above fabrication method.

FIG. 4 is a perspective view showing a modification of the sapphire substrate 11 when the step shown in FIG. 1A is completed. Six trenches 11a are arranged parallel to each other in the sapphire substrate 11. Three of these trenches 11a are arranged on each side of a trench 11d in a lateral direction. The sapphire substrate 11 with this structure is subjected to the steps shown in FIGS. 1A to 1D and cut by using, e.g., a dicer. Consequently, six light-emitting devices can be fabricated at once in the same process.

FIG. 5 is a perspective view showing one device finished as above. This light-emitting device 51 emits laser beams from two end faces 52 and 53 in the longitudinal direction of the trench 11a. Note that the end face 52 shown in FIG. 5 is formed by cleaving the substrate along the trench 11d in FIG. 4. However, this end face 52 can also be formed by dry etching or polishing. On the other hand, the end face 53 is formed by dry etching. That is, after an etching mask is formed on the bottom surface of the sapphire substrate 11, etching is performed by RIBE using a gas mainly consisting of chlorine.

The sapphire substrate 11 remaining around the light-emitting device 51 shown in FIG. 5 maintains the mechanical strength of the device. Also, a space 54 is formed between the end face 53 and the sapphire substrate 11. A component (not shown) such as a reflector, an optical modulator, or a light-receiving element can be accommodated in this space 54. It is also possible to form a component (not shown) such as a lens, a reflector, or a waveguide on the sapphire substrate 11.

Note that the structure of the gallium nitride compound semiconductor multiple layer according to the above embodiment is merely an example, and the present invention is not dependent on the structure of the gallium nitride compound semiconductor multiple layer. That is, the present invention is also applicable to a structure in which the p- and n-type layers are stacked in a reverse order or to a structure in which the gallium nitride compound semiconductor multiple layer has a different composition.

Figure 6B:
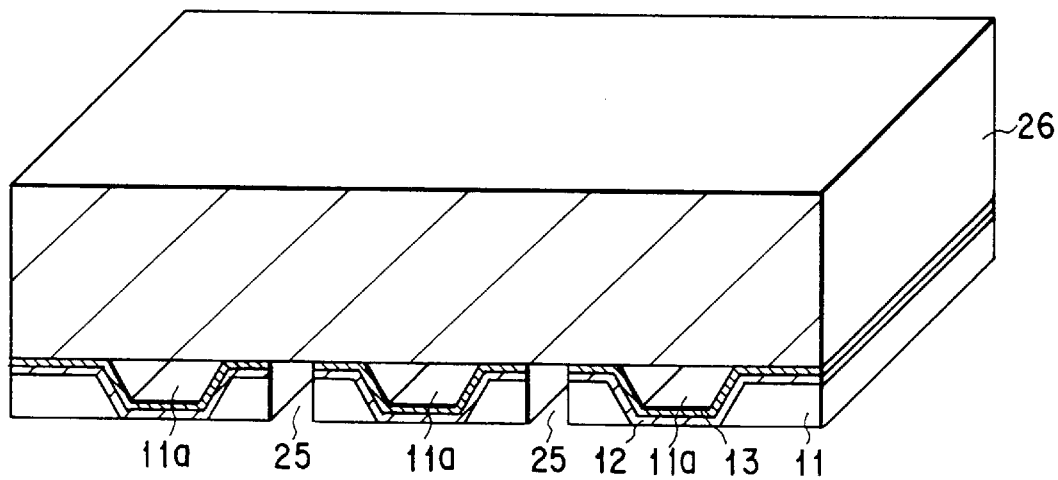
Figure 6C:
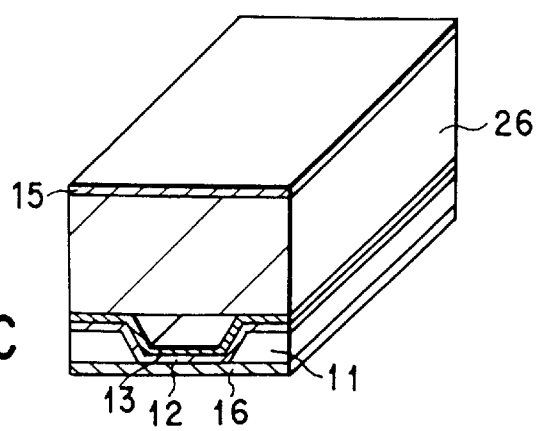

FIGS. 6A to 6C are perspective sectional views showing a method of fabricating a gallium nitride compound semiconductor laser (light-emitting device) according to another embodiment of the present invention in order of steps.

First, when trenches 11a for forming light-emitting devices are formed in a sapphire substrate 11 in the step shown in FIG. 1A, device isolation trenches 25 are formed between these trenches 11a so as to extend parallel to the trenches 11a. The trenches 25 are deeper than the trenches 11a by the total thickness of a buffer layer 12 and a gallium nitride compound semiconductor multiple layer 13. Subsequently, in the step shown in FIG. 1B, the buffer layer 12 and the gallium nitride compound semiconductor multiple layer 13 are formed on the sapphire substrate 11.

As shown in FIG. 6A, a second substrate 26 is adhered to the semiconductor multiple layer 13 on the sapphire substrate 11. This second substrate 26 is made of a material, such as a semiconductor of Group IV,II–VI, or III–V, e.g., Si, SiC, ZnO, ZnSe, BN, AlN, or GaAs, having cleavage properties and conducting properties. The second substrate 26 is so formed that its direction of easy cleavage equals the cleavage direction of the gallium nitride compound semiconductor multiple layer 13.

As shown in FIG. 6B, the sapphire substrate 11 is thinned from its bottom surface to expose the buffer layer 12 formed in the trenches 11a. Since the device isolation trenches 25 are deeper than the trenches 11a by the total thickness of the layers 12 and 13, the sapphire substrate 11 is separated by the device isolation trenches 25. In this step, the thickness of, e.g., 350 $\mu$m of the sapphire substrate 11 is decreased to about 40 $\mu$m. However, the sapphire substrate 11, the buffer layer 12, and the semiconductor multiple layer 13 are integrally supported by the second substrate 26. Therefore, the semiconductor multiple layer 13 is protected more reliably than in the fabrication method shown in FIGS. 1A to 1D. Also, when the opening of each device isolation trench 25 is used as a mark in this step, the work can be performed without damaging the semiconductor multiple layer 13 by excessively thinning the sapphire substrate 11.

Subsequently, an electrode 15 is formed on the top surface of the second substrate 26, and an electrode 16 is formed on the bottom surface of the buffer layer 12 (if the buffer layer 12 is conductive). If the buffer layer 12 is not conductive, the electrode 16 is formed after the semiconductor multiple layer 13 is exposed by further polishing the buffer layer 12. The top electrode 15 is connected through the conductive second substrate 26 to outer portions of the semiconductor multiple layer 13 located outside the trenches 11a.

Subsequently, the second substrate 26 is cut along the device isolation trenches 25 to isolate individual bar-like portions, i.e., semiconductor lasers as shown in FIG. 6C. Additionally, the gallium nitride compound semiconductor multiple layer 13 is cleaved along its cleavage direction to complete a laser resonator. Since the cleavage directions of the semiconductor multiple layer 13 and the second substrate 26 are equal, the resonator can be formed with a high controllability.

Note that if the second substrate 26 is not conductive, the electrode 15 is previously formed on the semiconductor multiple layer 13 in the trench 11a before the second substrate is adhered to the sapphire substrate 11.

FIGS. 7A to 7G are sectional views showing a method of fabricating a gallium nitride compound semiconductor laser (light-emitting device) according to still another embodiment of the present invention in order of steps.

Figure 7A:
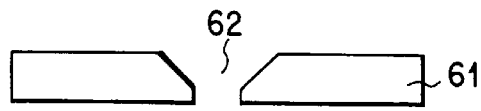
FIGS. 7A to 7G are sectional views showing a method of fabricating a gallium nitride compound semiconductor laser (light-emitting device) according to still another embodiment of the present invention in order of steps.

As shown in FIG. 7A, a tapered contact hole 62 is formed in a first sapphire substrate 61. To form this contact hole 62 in the sapphire substrate 61, any appropriate method can be selected in accordance with the size and shape of the contact hole 62, as in the method of forming the trench 11a in the sapphire substrate 11 in the step shown in FIG. 1A. Examples are mechanical processing methods such as a dicer, ultrasonic processing, and polishing, physical processing methods such as laser processing, and chemical processing methods such as chemical etching using a phosphoric acid etchant.

In this embodiment, the thickness of 350 $\mu$m of the first sapphire substrate 61 is decreased to 150 $\mu$m in this step. Subsequently, dicer processing, laser processing and ultrasonic processing are performed, and polishing is again performed to form the contact hole 62 whose minimum diameter or width is 20 $\mu$m in the sapphire substrate 61.

Figure 7B:
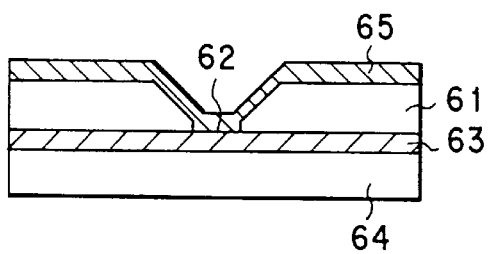

Meanwhile, a second sapphire substrate 64 on which a buffer layer 63 made of, e.g., AlN is stacked is prepared. As shown in FIG. 7B, the first sapphire substrate is adhered to this second sapphire substrate 64 such that the buffer layer 63 is sandwiched between them. A buried layer 65 made of, e.g., GaN is grown on the first sapphire substrate 61 by MOCVD to bury the contact hole 62. This buried layer 65 can also be formed by another crystal growth method, such as MBE, EB vapor deposition, or sputtering, instead of MOCVD.

Figure 7C:
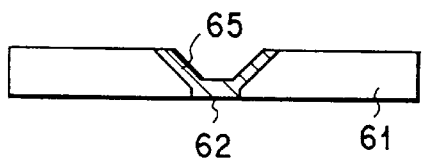

Subsequently, as shown in FIG. 7C, the buffer layer 63 is selectively etched with a phosphoric acid etchant to remove the second sapphire substrate 64 from the first sapphire substrate 61. The buried layer 65 grown on the first sapphire substrate 61 is then polished away except the portion formed in the tapered contact hole 62.

The buffer layer 63 and the buried layer 65 can be made of a conductive or nonconductive material, e.g., ZnO, GaN, AlN, GaAlN, LiAlO$_2$, LiGaO$_2$, MgAl$_2$O$_4$, or SiC, having a lattice constant very close to that of a gallium nitride compound semiconductor. However, it is desirable that the buffer layer 63 be made of a material which can be selectively etched away with respect to the buried layer 65. Also, instead of the second sapphire substrate 64 on which the buffer layer 63 is stacked, a substrate made of the material of the buffer layer 63 may be adhered to the first sapphire substrate 61.

Figure 7D:
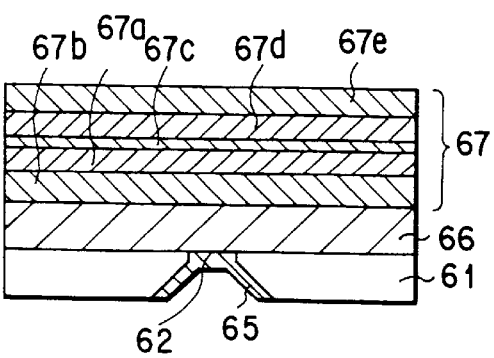

Subsequently, as shown in FIG. 7D, the sapphire substrate 61 is turned over, and a buffer layer 66 made of, e.g., GaN and a gallium nitride compound semiconductor multiple layer 67 are stacked in this order by MOCVD on the sapphire substrate 61. The buffer layer 66 can be made of a conductive or nonconductive material, e.g., ZnO, GaN, AlN, GaAlN, LiAlO$_2$, LiGaO$_2$, MgAl$_2$O$_4$, or SiC, having a lattice constant very close to that of a gallium nitride compound semiconductor. The gallium nitride compound semiconductor multiple layer 67 consists of an n-GAN contact layer 67a, an n-GaAlN cladding layer 67b, an InGaN active layer 67c, a p-GaAlN cladding layer 67d, and a p-GaN contact layer 67e in this order from the buffer layer 66. This gallium nitride compound semiconductor multiple layer 67 can also be formed by using another crystal growth method, such as MBE, instead of MOCVD.

Figure 7E:
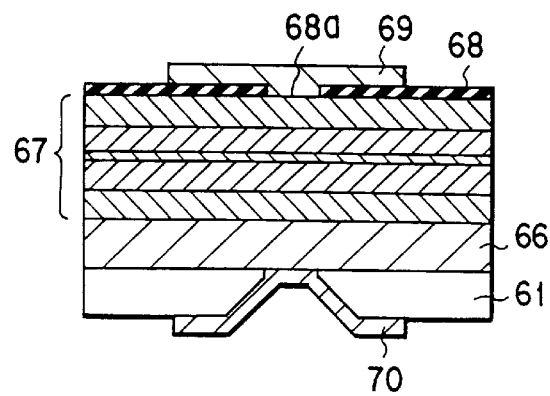

Subsequently, as shown in FIG. 7E, an SiO$_2$ oxide film 68 is formed as a protective film on the stacked gallium nitride compound semiconductor multiple layer 67, and a contact hole 68a is formed in a portion of the oxide film 68. Thereafter, a p-type electrode 69 is so formed as to bury the contact hole 68a and is connected to the top surface of the semiconductor multiple layer 67.

Figure 7F:
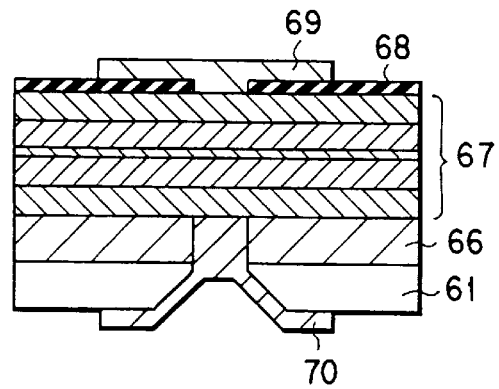
Figure 7G:
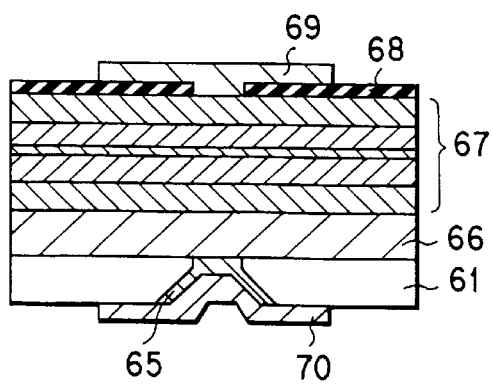

The buried layer 65 is removed by dry etching or wet etching by using the sapphire substrate 61 as a mask. Thereafter, an n-type electrode 70 is so formed as to bury the contact hole 62 and is connected to the bottom surface of the semiconductor multiple layer 67. If the buffer layer 66 is conductive, it is unnecessary to remove the buffer layer 66. However, if the buffer layer 66 is nonconductive, as shown in FIG. 7F, the buffer layer 66 is removed by further performing etching by using the sapphire substrate 61 as a mask, and the electrode 70 is so formed as to contact the bottom surface of the exposed semiconductor multiple layer 67. Also, if the buried layer 65 is conductive, it is unnecessary to remove the buried layer 65. That is, as shown in FIG. 7G, the electrode 70 can be formed on the buried layer 65.

The gallium nitride compound semiconductor light-emitting device according to this embodiment fabricated by the above method has a structure in which the p-type electrode 69 and the n-type electrode 70 are formed on the top and bottom surfaces of the device and oppose each other with the semiconductor multiple layer 67 between them. This narrows the gap between the electrodes 69 and 70 and lowers the device resistance. Also, the main part of the gallium nitride compound semiconductor multiple layer 67 is grown not on the sapphire substrate 61 but on the buried layer 65 which buries the contact hole 62. It is therefore considered that the layer 67 is free from a lattice mismatching problem and consists of a high-quality crystal.

Furthermore, in conventional devices as described earlier, after a gallium nitride compound semiconductor multiple layer is formed, a hole is formed in a sapphire substrate to form a contact hole for an electrode. Therefore, the semiconductor multiple layer is damaged by the processing, and this leads to degradation in the device characteristics such as an increase of the contact resistance. In contrast, in this embodiment, a contact hole is formed first. Accordingly, the gallium nitride compound semiconductor multiple layer 67 is not damaged, so the device characteristics are greatly improved compared to those of conventional devices.

Figure 8A:
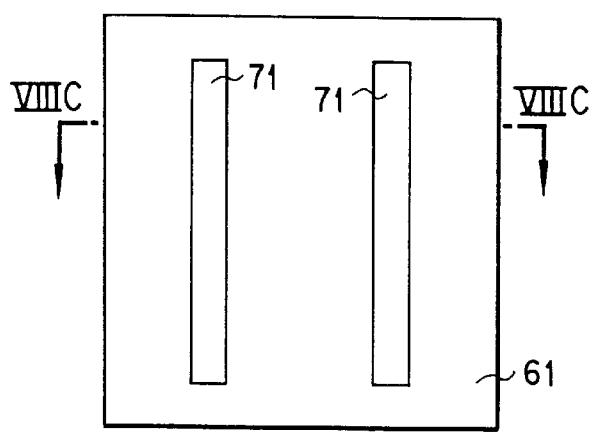
FIGS. 8A and 8B are plan views showing modifications of the fabrication method shown in FIGS. 7A to 7G.
Figure 8B:
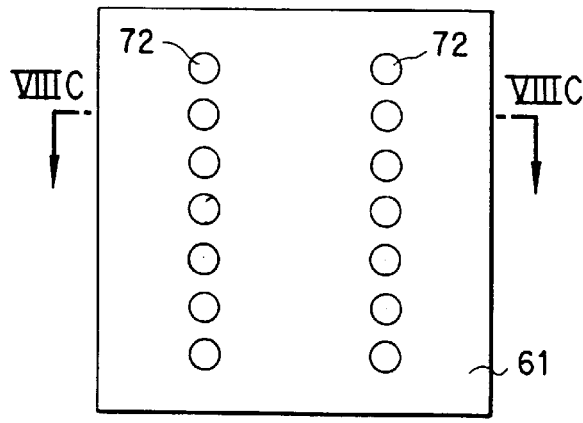
Figure 8C:
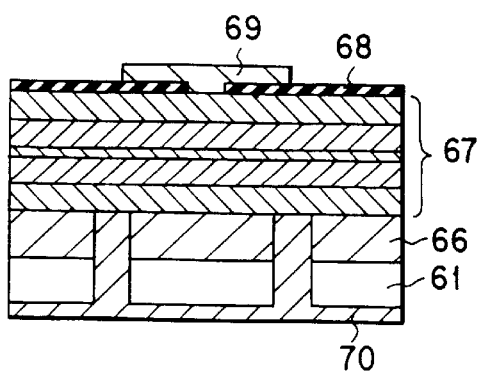
FIG. 8C is a sectional view taken along the line VIIIC—VIIIC in FIGS. 8A and 8B.

In the embodiment shown in FIGS. 7A to 7G, one contact hole 62 is formed in the sapphire substrate 61. However, it is also possible to form stripe contact holes 71 as shown in FIG. 8A or a plurality of contact holes 72 arranged along parallel straight lines as shown in FIG. 8B. FIG. 8C is a sectional view taken along the line VIIIC—VIIIC in FIGS. 8A and 8B. In FIG. 8C, the same reference numerals as in FIGS. 7A to 7G denote the same parts and a detailed description thereof will be omitted.

FIGS. 9A to 9D are a plan view and sectional views showing a method of fabricating a gallium nitride compound semiconductor laser (light-emitting device) according to still another embodiment of the present invention in order of steps.

In the embodiment shown in FIGS. 7A to 7G, the width of the contact hole 62 is 20 $\mu$m, i.e., relatively large. However, if the width of the contact hole 62 is as small as about 5 $\mu$m which is almost equivalent to the thickness of the buffer layer 66, it is no longer necessary to bury the contact hole 62. The embodiment shown in FIGS. 9A to 9D is based on this viewpoint.

Figure 9A:
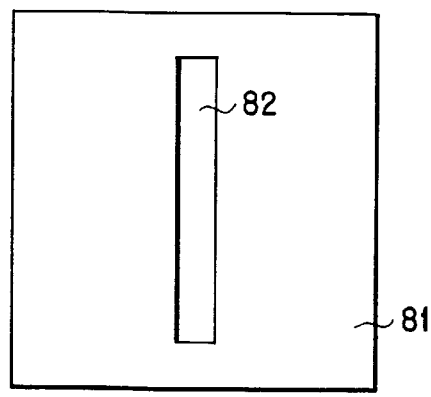
FIGS. 9A to 9D are a plan view and sectional views showing a method of fabricating a gallium nitride compound semiconductor laser (light-emitting device) according to still another embodiment of the present invention in order of steps.
Figure 9B:
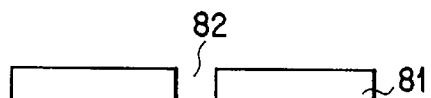

First, as shown in FIG. 9B, a stripe contact hole 82 is formed in a sapphire substrate 81. This contact hole 82 has wall surfaces perpendicular to the substrate surface and a width substantially equal to the substrate thickness. The planar shape of the contact hole 82 is as shown in FIG. 9A.

Figure 9C:
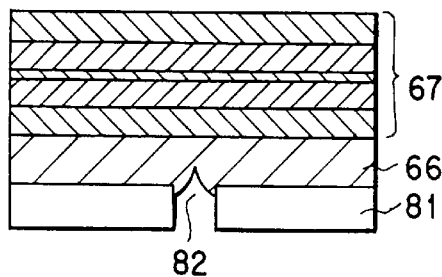

In FIG. 9C, a buffer layer 66 and a gallium nitride compound semiconductor multiple layer 67 are grown in this order on the surface of the sapphire substrate 81 including the contact hole 82. Since the width of the contact hole 82 is small, the buffer layer 66 is also grown on the contact hole. Consequently, a film with a flat top surface can be grown.

Figure 9D:
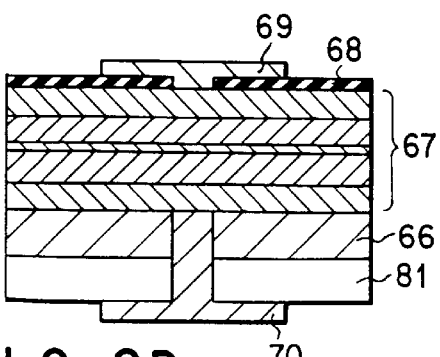

Subsequently, as shown in FIG. 9D, an SiO$_2$ oxide film 68 is formed as a protective film on the stacked gallium nitride compound semiconductor multiple layer 67, and a contact hole 68a is formed in a portion of the oxide film 68. Thereafter, a p-type electrode 69 is so formed as to bury the contact hole 68a and is connected to the top surface of the semiconductor multiple layer 67.

The buffer layer 66 is etched away through the contact hole 82 from the bottom surface side of the sapphire substrate 81. Thereafter, an n-type electrode 70 is so formed as to contact the bottom surface of the semiconductor multiple layer 67. If the buffer layer 66 is conductive, it is unnecessary to remove the buffer layer 66.

The gallium nitride compound semiconductor light-emitting device according to this embodiment fabricated by the above method has the same structure as the light-emitting device fabricated by the method shown in FIGS. 7A to 7G. However, since the area of the contact hole 82 is small, it is desirable to form a plurality of contact holes 82.

Note that the present invention can be applied not only to stripe structure lasers in the above embodiments but also to other light-emitting devices such as surface emission lasers and LEDs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A gallium nitride compound semiconductor light-emitting device comprising:

a sapphire substrate having a trench with two side wall surfaces which extend from a top surface to a bottom surface and incline so as to converge downward;

a gallium nitride compound semiconductor multiple layer supported by said sapphire substrate and having an n-type layer and a p-type layer, said semiconductor multiple layer having two side portions arranged along said two side wall surfaces and a central portion positioned between said two side portions and formed integrally with said two side portions; and first and second electrodes connected to top and bottom surfaces, respectively, of said semiconductor multiple layer so that said first and second electrodes are positioned on top and bottom sides of said device.

2. A device according to claim 1, wherein top and bottom surfaces of said central portion of said semiconductor multiple layer are positioned between the top and bottom surfaces of said sapphire substrate.

3. A device according to claim 1, wherein an angle of said two side wall surfaces with respect to the bottom surface of said central portion of said semiconductor multiple layer is 30° to 90°.

4. A device according to claim 1, wherein said trench has a rectangular planar shape, said two side wall surfaces are arranged on two opposing sides of said trench, and said semiconductor multiple layer has cleavage surfaces on two other opposing sides.

5. A device according to claim 1, wherein said first and second electrodes are so formed as to oppose each other on two sides of said central portion of said semiconductor multiple layer.

6. A device according to claim 1, further comprising a buffer layer formed between said sapphire substrate and said semiconductor multiple layer.

7. A device according to claim 6, wherein said buffer layer consists essentially of a material selected from the group consisting of ZnO, GaN, AlN, GaAlN, $LiAlO_2$, $LiGaO_2$, $MgAl_2O_4$, and SiC.

8. A device according to claim 1, further comprising a support substrate adhered to said sapphire substrate so as to cover said trench.

9. A device according to claim 8, wherein said support substrate consists essentially of a material selected from the group consisting of Si, SiC, ZnO, ZnSe, BN, AlN, and GaAs.

10. A device according to claim 8, wherein said semiconductor multiple layer has an outer portion positioned outside said trench and formed integrally with said central portion and said two side portions, said support substrate is conductive and connected to said outer portion of said semiconductor multiple layer, and said first electrode is formed on said support substrate.

11. A gallium nitride compound semiconductor light-emitting device comprising:

a sapphire substrate in which a contact hole is formed;

a buried layer formed in said contact hole and consisting essentially of a material having a lattice constant close to a lattice constant of a gallium nitride compound semiconductor;

a gallium nitride compound semiconductor multiple layer formed on said sapphire substrate so as to cover said contact hole and having an n-type layer and a p-type layer; and first and second electrodes connected to top and bottom surfaces, respectively, of said semiconductor multiple layer so that said first and second electrodes are positioned on top and bottom sides of said device, said second electrode being connected to said semiconductor multiple layer through said contact hole.

12. A device according to claim 11, wherein said buried layer consists essentially of a material selected from the group consisting of ZnO, GaN, AlN, GaAlN, $LiAlO_2$, $LiGaO_2$, $MgAl_2O_4$, and SiC.

* * * * *